(12) United States Patent
Huang et al.

(10) Patent No.: US 9,999,128 B2
(45) Date of Patent: Jun. 12, 2018

(54) METHOD OF MANUFACTURING AN ELECTRONIC STICKER

(71) Applicant: Chibitronics Private Limited, Singapore (SG)

(72) Inventors: Andrew Shane Huang, Singapore (SG); Jie Qi, New Port Richey, FL (US)

(73) Assignee: CHIBITRONICS PRIVATE LIMITED, Singapore (SG)

( * ) Notice: Subject to any disclaimer, the term of this patent is extended or adjusted under 35 U.S.C. 154(b) by 0 days. days.

(21) Appl. No.: 15/344,217

(22) Filed: Nov. 4, 2016

(65) Prior Publication Data

US 2017/0135212 A1 May 11, 2017

Related U.S. Application Data

(60) Provisional application No. 62/252,387, filed on Nov. 6, 2015.

(51) Int. Cl.
| | |
|---|---|
| *H05K 3/20* | (2006.01) |
| *H05K 1/11* | (2006.01) |
| *H05K 1/03* | (2006.01) |
| *H05K 1/09* | (2006.01) |
| *H05K 3/22* | (2006.01) |
| *H05K 3/46* | (2006.01) |
| *H01R 4/04* | (2006.01) |
| *H05K 3/32* | (2006.01) |

(52) U.S. Cl.
CPC ............... *H05K 1/117* (2013.01); *H01R 4/04* (2013.01); *H05K 1/0393* (2013.01); *H05K 1/092* (2013.01); *H05K 3/20* (2013.01); *H05K 3/22* (2013.01); *H05K 3/321* (2013.01); *H05K 3/4611* (2013.01); *H05K 2201/0154* (2013.01); *H05K 2203/0228* (2013.01); *H05K 2203/066* (2013.01)

(58) Field of Classification Search
CPC .......... B05D 5/12; H05K 3/10; H05K 3/4365; H05K 3/4638; H05K 3/4679; H05K 2203/0548; H05K 2203/0551; H05K 1/0393; H05K 1/092; H05K 1/117; H05K 3/20; H05K 3/22; H05K 3/321; H05K 3/4611; H05K 2201/0154; H05K 2203/066; H01K 2203/0228; H01R 4/04
See application file for complete search history.

(56) References Cited

U.S. PATENT DOCUMENTS

| | | | |
|---|---|---|---|
| 4,606,962 A | 8/1986 | Reylek et al. | |
| 9,030,724 B2 * | 5/2015 | Agrawal | G02F 1/1506 359/265 |
| 2011/0096388 A1 * | 4/2011 | Agrawal | G02F 1/1506 359/268 |

(Continued)

OTHER PUBLICATIONS

Miyachi, Anisotropic Conductive Adhesive Bonding, (Aug. 2010) [Retrieved on Feb. 21, 2017]. Retrieved from the Internet ,URL: http://www.amadamiyachieurope.com/cmdata/documents/White-paper-ACF-Bonding-Technology-08-10.pdf> p. 1-2.

(Continued)

*Primary Examiner* — Carl Arbes
(74) *Attorney, Agent, or Firm* — Kilpatrick Townsend & Stockton LLP

(57) ABSTRACT

Electronic sticker technology that enables assembly of circuits at ambient temperature without the use of any special tools.

7 Claims, 4 Drawing Sheets

(56) References Cited

U.S. PATENT DOCUMENTS

2013/0192356 A1    8/2013   De Graff et al.
2015/0310771 A1   10/2015   Atkinson et al.

OTHER PUBLICATIONS

International Search Report and Written Opinion dated Mar. 30, 2017 by the International Searching Authority for International Patent Application No. PCT/US2016/060606, which was filed on Nov. 4, 2016 and publishd as WO 2017/079616 on May 11, 2017 (Inventor—Qi et al.; Applicant—Chibitronics Private Id.) (10 pages).
U.S. Appl. No. 62/252,387, filed Nov. 6, 2015, Huang et al.
PCT/US2016/060606 (WO 2017/079616), filed Nov. 4, 2016 (May 11, 2017), Qi et al.

\* cited by examiner

METHOD OF MANUFACTURING AN ELECTRONIC STICKER

RELATED APPLICATIONS

This application claims priority to U.S. Provisional Application No. 62/252,387, entitled "Electronic Stickers With Re-Usability Enhancements," filed Nov. 6, 2015 and is hereby incorporated by reference in its entirety.

BACKGROUND

Field of the Disclosure

Aspects of the disclosure relate in general to electronic sticker technology that enables assembly of circuits at ambient temperature without the use of any special tools.

Description of the Related Art

An electrical network is an interconnection of electrical components (e.g. batteries, resistors, inductors, capacitors, switches) or a model of such an interconnection, consisting of electrical elements (e.g. voltage sources, current sources, resistances, inductances, capacitances).

An electrical circuit is a network consisting of a closed loop, giving a return path for the current. Linear electrical networks, a special type consisting only of sources (voltage or current), linear lumped elements (resistors, capacitors, inductors), and linear distributed elements (transmission lines), have the property that signals are linearly superimposable. They are thus more easily analyzed, using powerful frequency domain methods such as Laplace transforms, to determine DC response, AC response, and transient response.

SUMMARY

Embodiments include electronic sticker technology that enables assembly of circuits at ambient temperature without the use of any special tools.

An electronic sticker embodiment comprises a flexible substrate and a first wiring element. The first wiring element is bonded to the flexible substrate with an anisotropic conductive tape film. The anisotropic conductive tape film conducts current through a thickness of the anisotropic conductive tape film but not through a width or length of the anisotropic conductive tape film. The flexible substrate is polyimide. The first wiring element is metal wire, metal foil tape, metal fabric, metal thread, metal foils, metal inks, suspensions of conductive nanoparticles, carbon-based inks or conductive film.

A method of manufacturing an electronic sticker includes cutting an anisotropic adhesive into an anisotropic adhesive panel. The anisotropic adhesive panel having a first side and a second side. The first side of the anisotropic adhesive panel is protected with a first wax paper. The second side of the anisotropic adhesive panel is protected with a second wax paper. The second wax paper has a lower surface energy than the first wax paper. The anisotropic adhesive panel is die-cut using a full-release technique. The die-cutting forms a pattern featuring alignment holes. A fully-assembled electronics circuit module is held in place on a flexible substrate with a vacuum chuck that has been machined with cavities to accommodate a profile on a first side of the flexible substrate. The vacuum chuck contains pins that pierce both the flexible substrate and the anisotropic adhesive panel. The second wax paper is peeled back, semi-exposing the anisotropic adhesive panel. The semi-exposed anisotropic adhesive panel is aligned to the pins of the vacuum chuck. The anisotropic adhesive panel and the fully-assembled electronics circuit module is laminated to the flexible substrate with a roller. The roller applies a temperature of at least 30° C. and a pressure of at least 15 psi for a period of at least five seconds to affect the lamination process. The anisotropic adhesive panel, the fully-assembled electronics circuit module, and the flexible substrate is held in an oven at approximately 40° C. for at least half an hour.

BRIEF DESCRIPTION OF THE DRAWINGS

The figures below illustrate electronic sticker technology that enables assembly of circuits at ambient temperature without the use of any special tools.

DETAILED DESCRIPTION

Figure 1:
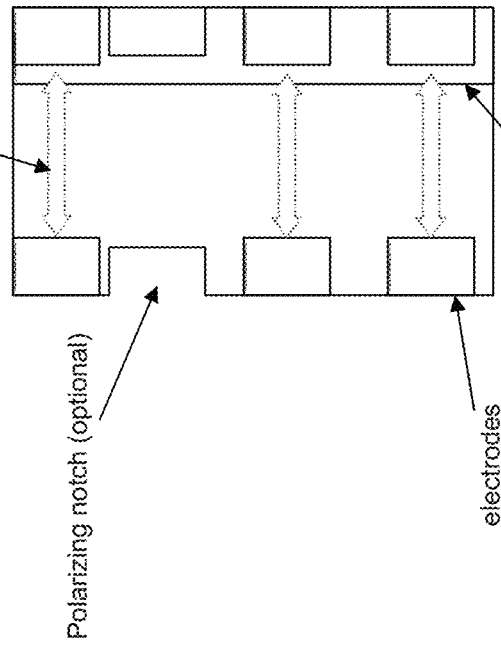
FIG. 1 illustrates a clamp and test variant embodiment

Aspects of the present disclosure include electronic sticker technology to enable the assembly of circuits at ambient temperature without the use of any special tools. Through the use of isotropically or (more typically) anisotropically conductive adhesives, functional circuit elements are combined with wire elements using nothing more than a peel-and-stick motion.

One aspect of electronic sticker technology is the absence of any requirement for soldering, brazing, or other melting process involving elevated temperatures. A further aspect of electronic sticker technology is the absence of any splicing, wire wrapping, connectorization, or permanent requirement for clamping or pressure to maintain contact between circuit elements. These two properties enable electronic stickers to be used with a broad range of materials that would otherwise melt or burn, such as but not limited to paper, plastics, live tissue, plants, and fabrics.

Embodiment stickers are as flexible as paper. While not all circuit stickers are as flexible the described embodiments, the particular material system enables most of embodiment stickers to be easily placed on curved surfaces, such as cardboard tubes, cups, and glasses. While prior art stickers use thin FR-4 as their base material, this material is still too rigid to easily conform on non-flat surfaces. Embodiments of the present disclosure use a polyimide (PI) substrate with coverlay, which accounts for enhanced flexibility and robustness to repeated flexing.

Wiring elements used with electronic sticker technology may comprise any conductive or semi-conductive material which is compatible with conductive adhesives. Examples of viable wiring elements include metal wire, metal foil tape, metal fabric, metal thread, metal foils, metal inks, suspensions of conductive nanoparticles, and carbon-based inks or films. These conductive elements have been demonstrated with electronic sticker technology using combinations of manual application, computer numerically controlled (CNC) additive (e.g. 3D printing), screen-printed, photolithographically defined, and/or CNC subtractive techniques (e.g. milling).

Embodiment electronic stickers use anisotropic conductive tape films to bond the polyimide (PI) substrates to wiring elements. Anisotropic conductive tape films have the property that they only conduct electricity in one dimension (typically the "Z direction", or through the thickness of the film, but not laterally along the width or length of the film). This allows the film to be deposited uniformly across a series of electrodes without causing adjacent electrodes to short circuit. Other stickers are known to use isotropic conductive tapes. Since isotropic tapes can conduct electricity laterally, these films require isolation to prevent short circuits between adjacent contacts. The isolation can be done either before or after processing. For example, in one embodiment, the films may be cut into small pieces or arrays of dots and subsequently applied to the electrodes. In another embodiment, the film may be deposited in a uniform sheet and then stripped back using a combination of mechanical or chemical processing techniques.

Embodiments of electronic stickers also provide the stickers to users on panels with sacrificial backings, similar to conventional decorative stickers. As a result, embodiment stickers typically lack any tabs which retain them to the backing or other framework, thus allowing for a hassle-free peel-and-stick experience. The panels and/or backings are typically sized larger than the electronic sticker, so that users can easily grab onto the backing. Other stickers cut the backing to the same size as the sticker, thus requiring users to pick at an edge to work the backing free of the sticker.

Significantly, the absence of soldering does not mean that the stickers are incompatible with soldering or other high-temperature processes. In fact, embodiment stickers use PI as its substrate and its melting point is far above that of most solders. Thus, embodiment stickers are explicitly designed to also support direct soldering, if the user requires it to achieve certain mechanical reliability or environmental robustness goals.

The solderability of the embodiment also means we can use conventional, low-cost mass-manufacturing techniques to pre-attach components to the substrate, thereby creating electronic circuit sticker modules of almost arbitrary complexity. While other electronic stickers use lower-cost, restricted-temperature plastics such as polyethylene, polyethylene terepthalate (e.g. mylar), or polystyrene as their substrates, these materials are incompatible with standard solders and therefore cannot directly use conventional mass-manufacturing techniques for electronic products. Instead they must use low-temperature solders or conductive epoxies, which often have inferior electrical and mechanical properties to conventional solder. This limits the ability to integrate advance circuits such as those involving RF and microcontrollers.

In many cases, electronic stickers are cheap enough to be considered disposable. If a circuit is not working correctly or needs to be modified, the original sticker is typically discarded, and a new one is placed down. While the used sticker can have its adhesive refurbished via a combination of cleaning with organic solvent and reapplication of anisotropic adhesive film, the process is typically not worth the effort, and the process also requires a certain degree of manual skill to execute successfully.

However, the opportunity to create modules of arbitrary complexity also implies that the value of an electronic sticker module may increase to a point where it is no longer economically feasible to be considered disposable. Our electronic sticker process enables the creation of circuit sticker modules that incorporate a variety of microcontrollers, wireless radios, sensors, and/or transducers of fairly high value. Therefore, embodiments include electronic stickers which can be temporarily or repeatedly bonded into a circuit for testing or for educational/experimentation/demonstration purposes.

Re-usable electronic stickers may be manufactured using the following method described below.

The non-reusable electronic stickers previously manufactured feature the non-selective deposition of anisotropic tape across entire panels of flexible circuit materials.

Reusable electronic sticker embodiments are extremely low cost and may be compatible with "reel-to-reel" or continuous lamination processing techniques.

The manufacturing process embodiment is semi-continuous. Rolls of anisotropic adhesive are first cut into large panels, and protected using wax paper on both sides. One of the wax papers has a much lower surface energy than the other, to cause the paper to preferentially release on one side. The panels are then die-cut using a full-release technique (e.g. the cutting blade goes all the way through the adhesive material). This creates holes in the tape, which effects the selective deposition of anisotropic tape on the ultimate substrate. The die cutting pattern features alignment holes to ensure proper alignment during the later lamination stages. Furthermore, the arrangement of the electronic modules' electrodes is designed to avoid large continuous holes in the panels, or slivers of material less than 2 mm. This ensures that the tape has sufficient robustness to survive lamination.

After cutting comes lamination. The fully-assembled electronics circuit module is held in place with an optionally heated vacuum chuck that has been machined with cavities to accommodate the profile of the parts on the non-laminate side of the flex material. The vacuum chuck contains pins that pierce both the electronic flex substrate and the anisotropic tape sheet, ensuring proper alignment. The lower-surface energy wax paper is peeled back, and the semi-exposed anisotropic tape is aligned to the pins on the chuck. A soft, optionally heated roller is used to apply a temperature of at least 30° C. and a pressure of at least 15 psi for a period of at least five seconds to affect the lamination process. After lamination, the assemblies are held in an oven at approximately 40° C. for at least half an hour to accelerate curing. The temperature may vary between 32° C. and 48° C.

The temperatures specified above are not very high, but important. The problem is that often factories are not heated, and in the winter the factory temperatures drop to below 10° C. and the adhesives will fail to bond. Hence in lieu of heated tooling, some embodiments simply use a heated room, but it is often more cost-efficient to just heat the tools than the entire factory.

Sticker design method "clamp & test": There are two design patterns for anisotropic adhesive deposition which we are developing. The first is called a "clamp & test" variant. The idea of this pattern is to enable unlimited re-use of the stickers during prototyping and testing by offering a stiffened edge of the sticker that is free of any adhesive. See diagrams below for details of the disclosure.

FIG. 1 illustrates basic anatomy of the clamp & test variant. Electrodes on opposite sides are electrically connected within the sticker itself.

Figure 2:
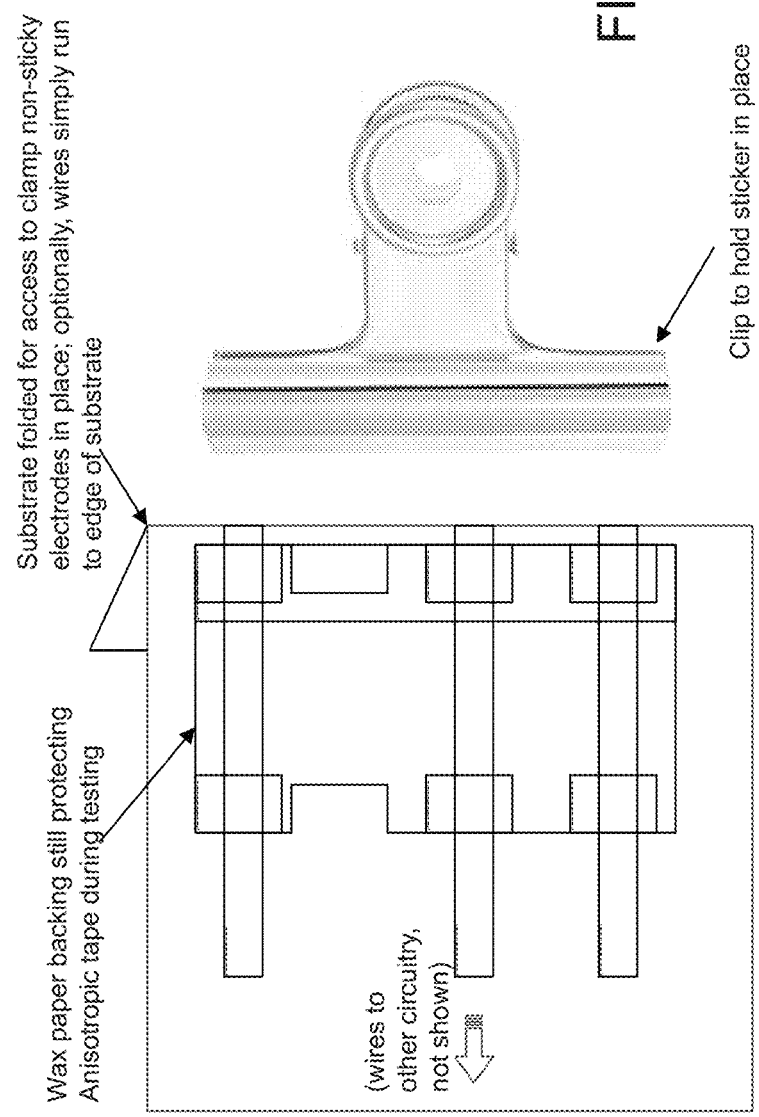
FIG. 2 depicts an embodiment used in a circuit.

FIG. 2. illustrates using a variant in a circuit. The wires are first laid down; they may either be brought to an edge for easy access, or simply laid out in parallel long tracks, and then folded at the region where the electronic sticker should be placed. The sticker is then held in place with a clip; the wax backing on the adhesive is not removed. For applications where folding is not desired, the tape can also be held in place with weight coated in a compliant material that helps ensure good contact. This form allows the sticker to be re-used indefinitely.

In another embodiment, instead of being held in place with a clip, the sticker is held in a two-ring, three-ring, or other plural-ring binder. In such an embodiment, multiple stickers may be attached within the binder, and allowed to make electrical contact with each other.

Additionally, the sticker may be used with free-hanging alligator clips onto the adhesive-free electrodes. This use case does not require the paper backing at all, and is anticipated to be popular with educators and hobbyists with needs for "quick and dirty" prototypes.

Figure 3:
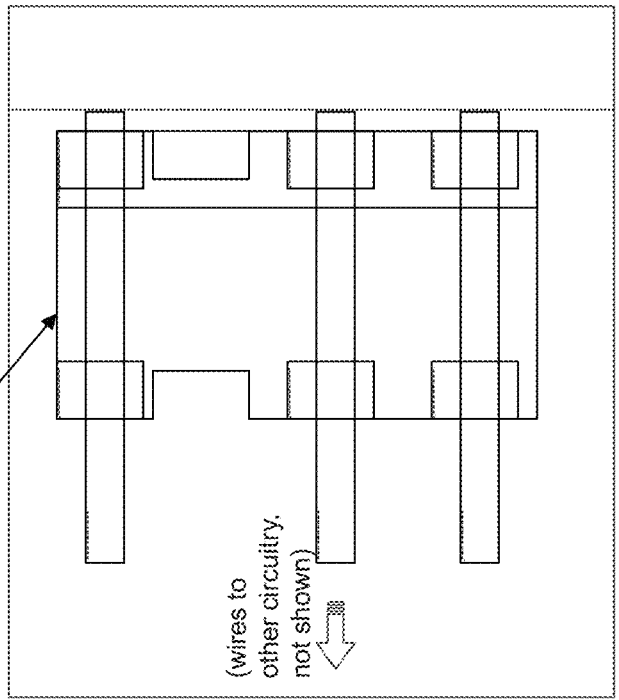
FIG. 3. illustrates an embodiment where the circuit has been proven to be tested and the design is ready to be finalized

FIG. 3 illustrates a step once the circuit has been proven to be tested and the design is ready to be finalized. The clip is removed. The wax paper backing is removed from the adhesive region, and the sticker is placed into a permanent position over the same electrodes used for testing. This is the reason why the electrodes on both sides of the module have parallel pinouts—a user can test using one side, and make permanent with the other.

Sticker design method "multiple-stick": The second variant of the re-usable sticker we are developing is called the multiple-stick variant. This variant introduces multiple sacrificial electrodes that are clipped off every time the sticker needs to be re-used. This embodiment requires no clamping and/or folding of the paper for testing. However, the number of times the sticker can be re-used is limited by the number of sacrificial electrodes.

Figure 4:
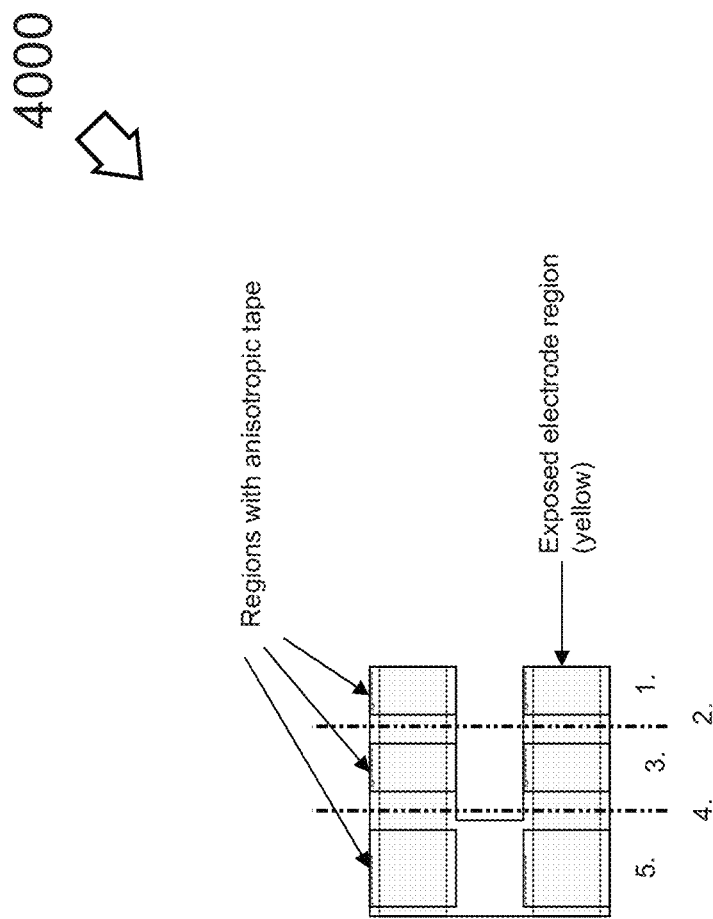
FIG. 4 shows a multiple-stick embodiment.

FIG. 4 illustrates an example of a multiple-stick variant. Anisotropic tape is only applied in the hatched regions, over exposed electrode lines. Each tape island has its own protective wax backing. In the case above, there are only two electrodes but the sticker can have more. In this scenario, the user would first peel-and-stick using the electrodes at (1). When the sticker is desired to be re-used, the sticker is cut along line (2), and electrodes at (3) are exposed and stuck into a new circuit. Finally, the sticker can be cut along line (4) and used one last time by exposing the electrodes at (5).

It is important to note that the multiple re-use technique is simply a method of decorating an electrode, and is thus compatible with the "clamp & test" variant. Specifically, the electrodes on the clamp & test variant can be extended to be longer and have adhesive applied selectively to create the similar form presented here.

Use of selective stiffening. In all cases, additional polyimide stiffeners (strips of PI film ~0.3 mm in thickness) may be laminated onto the flexible substrate to improve the robustness of the clamping or re-use points. This is particularly relevant for the "clamp & test" variant, because without the stiffener, free-hanging alligator clips can easily tear into and damage the thin, flexible circuit material.

The previous description of the embodiments is provided to enable any person skilled in the art to practice the disclosure. Thus, the present disclosure is not intended to be limited to the embodiments shown herein, but is to be accorded the widest scope consistent with the principles and features disclosed herein.

What is claimed is:

1. A method of manufacturing an electronic sticker comprising:
   cutting an anisotropic adhesive into an anisotropic adhesive panel, the anisotropic adhesive panel having a first side and a second side;
   protecting the first side of the anisotropic adhesive panel with a first wax paper;
   protecting the second side of the anisotropic adhesive panel with a second wax paper, the second wax paper having a lower surface energy than the first wax paper;
   die-cutting the anisotropic adhesive panel using a full-release technique, the die-cutting forming a pattern featuring alignment holes;
   holding a fully-assembled electronics circuit module in place on a flexible substrate with a vacuum chuck that has been machined with cavities to accommodate a profile on a first side of the flexible substrate, the vacuum chuck containing pins that pierce both the flexible substrate and the anisotropic adhesive panel;
   peeling back the second wax paper, semi-exposing the anisotropic adhesive panel;
   aligning the semi-exposed anisotropic adhesive panel to the pins of the vacuum chuck;
   laminating the anisotropic adhesive panel and the fully-assembled electronics circuit module to the flexible substrate with a roller;
   holding the anisotropic adhesive panel, the fully-assembled electronics circuit module and the flexible substrate in an oven.

2. The method of claim 1, wherein the roller applies a temperature of at least 30° C.

3. The method of claim 2, wherein the roller further applies a pressure of at least 15 psi.

4. The method of claim 3, wherein the roller is applied for a period of at least five seconds.

5. The method of claim 4, wherein the holding in the oven is at approximately 40° C.

6. The method of claim 5, wherein the holding in the oven for at least half an hour.

7. The method of claim 6, wherein the vacuum chuck is heated.

* * * * *